US010971921B2

(12) United States Patent
Strouse et al.

(10) Patent No.: US 10,971,921 B2
(45) Date of Patent: Apr. 6, 2021

(54) DC-DC CONVERTERS HAVING BULLET TERMINALS

(71) Applicant: VERTIV ENERGY SYSTEMS, INC., Lombard, IL (US)

(72) Inventors: Timothy Brooklyn Strouse, North Ridgeville, OH (US); Michael Francis Smith, Columbia Station, OH (US); Paul Brian Hiidel, Strongsville, OH (US)

(73) Assignee: Vertiv Corporation, Columbus, OH (US)

( * ) Notice: Subject to any disclaimer, the term of this patent is extended or adjusted under 35 U.S.C. 154(b) by 427 days.

(21) Appl. No.: 15/949,766

(22) Filed: Apr. 10, 2018

(65) Prior Publication Data

US 2018/0294641 A1 Oct. 11, 2018

Related U.S. Application Data

(60) Provisional application No. 62/483,622, filed on Apr. 10, 2017.

(51) Int. Cl.
*H02H 7/12* (2006.01)
*H02J 9/06* (2006.01)
(Continued)

(52) U.S. Cl.
CPC ........... *H02H 7/1213* (2013.01); *H02J 9/061* (2013.01); *H05K 5/0073* (2013.01);
(Continued)

(58) Field of Classification Search
CPC .......... H02B 1/04; H02B 1/056; H02H 3/087; H02H 7/1213; H02H 7/20; H02H 7/22;
(Continued)

(56) References Cited

U.S. PATENT DOCUMENTS 5,926,373 A 7/1999 Stevens
5,940,288 A * 8/1999 Kociecki ............ H05K 7/20727
361/688

(Continued)

FOREIGN PATENT DOCUMENTS

CN 202142982 U 2/2012
EP 1160952 A2 12/2001
(Continued)

OTHER PUBLICATIONS

Ericsson Ab. Ericsson PKM 4000D PINB series Direct Converters, Nov. 2011, https://www.mouser.com/ds/2/138/8701-EN_LZT146416_EN_F_PDFV1R6-13268.pdf, pp. 1-34.

*Primary Examiner* — Fred E Finch, III
(74) *Attorney, Agent, or Firm* — Harness, Dickey & Pierce, P.L.C.

(57) ABSTRACT

Example DC-DC converters include a housing having at least two bullet terminals. The at least two bullet terminals are configured to mate with corresponding terminals in a DC bullet breaker panel. The converter also includes a DC-DC voltage converter circuit coupled between the at least two bullet terminals, and a controller coupled with the DC-DC voltage converter circuit. The controller is configured to control the DC-DC converter circuit to convert a DC input voltage at a first one of the at least two bullet terminals to a different DC output voltage at another one of the at least two bullet terminals. Methods of converting DC voltages using DC-DC converters having bullet terminals are also disclosed.

20 Claims, 5 Drawing Sheets

(51) Int. Cl.
*H02M 3/00* (2006.01)
*H02B 1/056* (2006.01)
*H05K 5/00* (2006.01)
*H05K 5/02* (2006.01)

(52) U.S. Cl.
CPC ........... *H05K 5/0247* (2013.01); *H02B 1/056* (2013.01); *H02J 2310/10* (2020.01)

(58) Field of Classification Search
CPC ...... H02H 9/02; H02J 1/001; H02J 9/04–061; H02J 13/00036; H02J 2310/10; H02M 3/00–44; H05K 7/186; H05K 5/0073; H05K 5/0247; H04Q 1/03; H04Q 1/032
See application file for complete search history.

(56) References Cited

U.S. PATENT DOCUMENTS

| | | | | |
|---|---|---|---|---|
| 6,358,099 | B1* | 3/2002 | Kolody | H02B 1/056 439/716 |
| 7,466,038 | B2* | 12/2008 | Gaudreau | G06F 1/26 307/82 |
| 7,554,796 | B2* | 6/2009 | Coffey | H05K 7/1439 361/643 |
| 7,620,171 | B2* | 11/2009 | Sclater | H04L 12/10 379/322 |
| 8,625,748 | B2 | 1/2014 | Kioski et al. | |
| 8,848,346 | B2 | 9/2014 | Johnsen | |
| 9,448,576 | B2* | 9/2016 | Chamberlain | H04W 52/00 |
| 2001/0046144 | A1* | 11/2001 | Murabayashi | H05K 7/1432 363/69 |
| 2004/0140718 | A1* | 7/2004 | Wise, Jr. | H02J 1/102 307/75 |
| 2005/0226013 | A1* | 10/2005 | Fontana | H02M 3/155 363/65 |
| 2006/0082222 | A1* | 4/2006 | Pincu | G06F 1/3287 307/29 |
| 2010/0237699 | A1* | 9/2010 | Gibson | H04Q 1/03 307/39 |
| 2012/0038213 | A1* | 2/2012 | Vogel | H02J 9/061 307/64 |
| 2014/0015321 | A1* | 1/2014 | Nordin | H02J 1/001 307/43 |
| 2015/0236507 | A1* | 8/2015 | Burant | H02H 9/005 307/23 |
| 2015/0245531 | A1* | 8/2015 | Meinecke | H05K 7/1489 361/679.02 |
| 2017/0077709 | A1 | 3/2017 | Kim et al. | |
| 2017/0338690 | A1* | 11/2017 | Higashide | H01M 10/441 |
| 2018/0275700 | A1* | 9/2018 | Rearick | H02J 1/02 |
| 2020/0028352 | A1* | 1/2020 | Strouse | H02H 7/22 |

FOREIGN PATENT DOCUMENTS

| | | |
|---|---|---|
| EP | 2511984 A1 | 10/2012 |
| GB | 2392788 A | 3/2004 |
| GB | 2503479 A | 1/2014 |
| JP | 2014171313 A | 9/2014 |
| JP | 2015012786 A | 1/2015 |
| KR | 20090043462 A | 5/2009 |
| KR | 101642761 B1 | 8/2016 |
| KR | 20180076897 A | 7/2018 |

* cited by examiner

DC-DC CONVERTERS HAVING BULLET TERMINALS

CROSS-REFERENCE TO RELATED APPLICATION

This application claims the benefit and priority of U.S. Provisional Application No. 62/483,622 filed Apr. 10, 2017. The entire disclosure of the above application is incorporated herein by reference.

FIELD

The present disclosure relates to DC-DC converters having bullet terminals and methods of converting DC voltages using DC-DC converters having bullet terminals.

BACKGROUND

This section provides background information related to the present disclosure which is not necessarily prior art.

Wireless service providers use power radio equipment located on radio towers at various heights. Due to a cable loop length from a power system to the radio equipment, a DC voltage at the radio equipment is reduced, and the DC voltage also decreases during an AC outage (due to battery discharge). Wireless providers often deploy a stand-alone DC-DC converter system connected to an existing −48 VDC rectifier/battery plant to increase the DC output voltage to the radio equipment to allow the radio equipment to sustain operation during an outage, and to reduce the size of the cable feeding the remote radio equipment. In addition, distributed antenna system (DAS) providers sometimes deploy a stand-alone Class 2 circuit converter system that limits each circuit to 100 W. However, the installation of stand-alone converter systems requires considerable extra expense as well as extra rack space.

SUMMARY

This section provides a general summary of the disclosure, and is not a comprehensive disclosure of its full scope or all of its features.

According to one aspect of the present disclosure, a DC-DC converter includes a housing having at least two bullet terminals. The at least two bullet terminals are configured to mate with corresponding terminals in a DC bullet breaker panel. The converter also includes a DC-DC voltage converter circuit coupled between the at least two bullet terminals, and a controller coupled with the DC-DC voltage converter circuit. The controller is configured to control the DC-DC converter circuit to convert a DC input voltage at a first one of the at least two bullet terminals to a different DC output voltage at another one of the at least two bullet terminals.

According to another aspect of the present disclosure, a method of converting DC voltage using a DC-DC converter is disclosed. The DC-DC converter includes a housing having at least two bullet terminals. The at least two bullet terminals are configured to mate with corresponding terminals of a DC bullet breaker panel. The device also includes a DC-DC converter circuit coupled between the at least two bullet terminals, and a controller coupled with the DC-DC converter circuit. The method includes receiving a DC input voltage from one of the corresponding terminals of the DC bullet breaker panel at a first one of the at least two bullet terminals, and converting the received DC input voltage to a different DC output voltage using the DC-DC converter circuit. The method also includes supplying the converted DC output voltage to another one of the corresponding terminals of the DC bullet breaker panel via another one of the at least two bullet terminals.

Further aspects and areas of applicability will become apparent from the description provided herein. It should be understood that various aspects and features of this disclosure may be implemented individually or in combination with one or more other aspects or features. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

Figure 1:
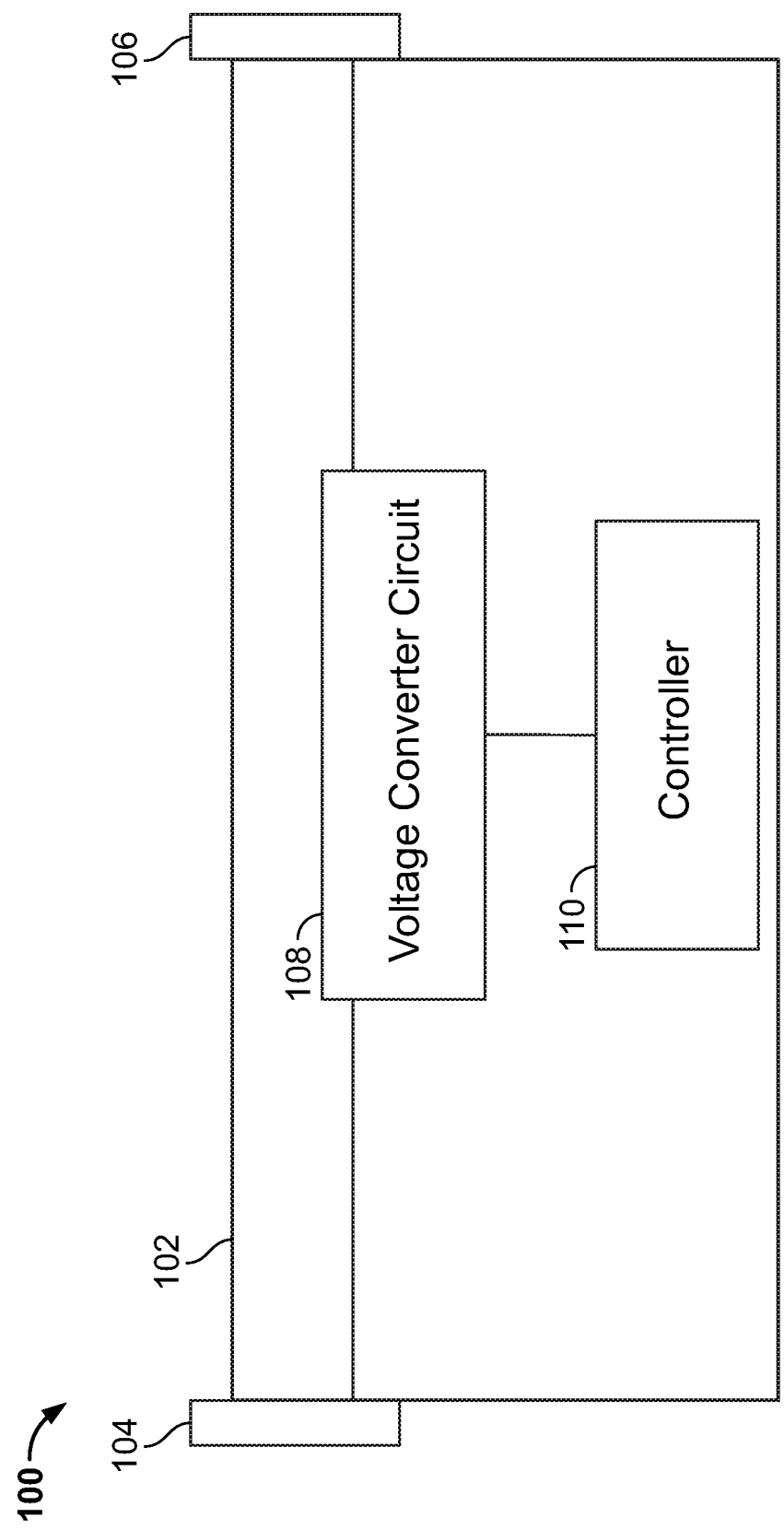
FIG. 1 is a block diagram of a DC-DC converter according to one example embodiment of the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

A DC-DC converter according to one example embodiment of the present disclosure is illustrated in FIG. 1 and indicated generally by reference number 100. As shown in FIG. 1, the DC-DC converter 100 includes a housing 102 having a pair of bullet terminals 104 and 106. The bullet terminal 104 and the bullet terminal 106 are configured to mate with corresponding terminals in a DC bullet breaker panel.

The DC-DC converter 100 further includes a DC-DC voltage converter circuit 108 coupled between the bullet terminal 104 and the bullet terminal 106, and a controller 110 coupled with the DC-DC voltage converter circuit 108. The controller 110 is configured to control the DC-DC voltage converter circuit 108 to convert a DC input voltage at the bullet terminal 104 to a different DC output voltage at the bullet terminal 106.

For example, if the bullet terminal 104 is an input terminal (e.g., bullet style line terminal, etc.) and the bullet terminal 106 is an output terminal (e.g., bullet style load terminal, etc.), the DC-DC voltage converter circuit 108 may convert a DC input voltage received at the bullet terminal 104 to a different DC output voltage at the bullet terminal 106.

As described above, the bullet terminal 104 and the bullet terminal 106 are configured to mate with corresponding terminals in a DC bullet breaker panel. For example, the bullet terminals 104 and 106 may be sized, spaced, etc. substantially the same as a bullet DC circuit breaker. As used herein, a "bullet DC circuit breaker" may refer to any circuit breaker having bullet terminals, any fuse having bullet terminals, etc., that is configured to plug into a DC bullet breaker panel.

In some cases, the housing 102 may have substantially the same form factor as a bullet DC circuit breaker. For example, the housing 102 may have the same shape as a bullet DC circuit breaker, the same size as a bullet DC circuit breaker, etc. Therefore, the housing 102 and bullet terminals 104 and 106 may form a DC-DC converter package that can plug into a DC bullet breaker panel via the bullet terminals 104 and 106.

The DC-DC voltage converter circuit 108 may comprise any suitable DC-DC converter topology such as a switching power supply (e.g., a switched-mode power supply (SMPS)). The DC-DC voltage converter circuit 108 can include one or more switches, one or more diodes, one or more capacitors, a transformer, etc. The controller 110 may be configured to control switching operation of the DC-DC voltage converter circuit 108.

The DC-DC voltage converter circuit 108 may be configured to convert a DC input voltage within any suitable specified voltage input range, to a DC output voltage within any suitable specified voltage output range. For example, in some embodiments the specified DC voltage input range is about −42 VDC to −58 VDC. In this case, the DC-DC voltage converter circuit 108 may convert the DC voltage input to a DC voltage output range of about −48V to −72 VDC.

In other embodiments, the DC-DC voltage converter circuit 108 may receive a positive DC input voltage at the bullet terminal 104 and provide a positive DC output voltage at the bullet terminal 106, may receive a positive DC input voltage at the bullet terminal 104 and provide a negative DC output voltage at the bullet terminal 106, may receive a negative DC input voltage at the bullet terminal 104 and provide a positive DC output voltage at the bullet terminal 106, etc. The DC-DC voltage converter circuit 108 may receive, convert and provide DC voltages outside of the ranges listed above.

Figure 2:
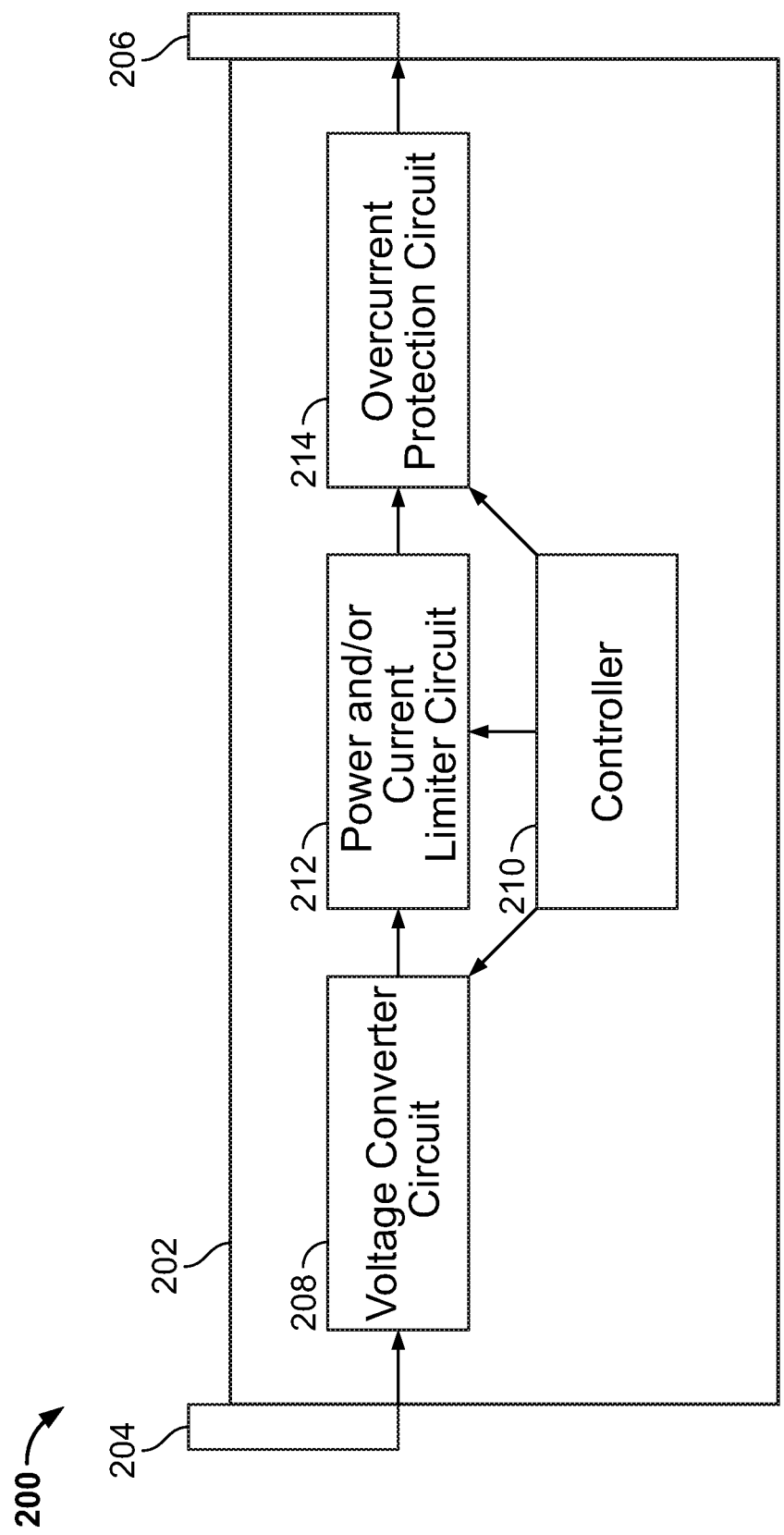
FIG. 2 is a block diagram of a DC-DC converter having a power and/or current limiter circuit and an overcurrent protection circuit according to another example embodiment of the present disclosure.

FIG. 2 illustrates a DC-DC converter 200 according to another example embodiment of the present disclosure. The DC-DC converter 200 includes a housing 202 having a pair of bullet terminals 204 and 206.

The housing 202, and the bullet terminals 204 and 206 may form a DC-DC converter package that can mate with a DC bullet breaker panel via the bullet terminals 204 and 206. For example, a DC bullet breaker panel in a DC power distribution system may include bullet terminals for mating with bullet DC circuit breakers, and the bullet terminals 204 and 206 of the DC-DC converter 200 may be coupled with the bullet terminals of the DC circuit breaker panel.

The DC-DC converter 200 also includes a DC-DC voltage converter circuit 208 coupled between the bullet terminal 204 and the bullet terminal 206, and a controller 210 coupled with the DC-DC voltage converter circuit 208. The controller 210 is configured to control the DC-DC voltage converter circuit 208 to convert a DC voltage.

As shown in FIG. 2, the DC-DC converter 200 includes a power and/or current limiter circuit 212 coupled between the bullet terminals 204 and 206 to limit a DC output power and/or DC output current of the DC-DC converter 200. For example, the power and/or current limiter circuit 212 may be configured to limit a DC output power at the bullet terminal 206 to below a specified output power threshold, to limit a DC output current at the bullet terminal 206 to below a specified output current threshold, to limit both the DC output power and the DC output current, etc.

The power and/or current limiter circuit 212 may include any suitable power and/or current limiting circuit topology (e.g., an inrush current limiter, etc.). The power and/or current limiter circuit 212 can include one or more resistors, switches, diodes, negative temperature coefficient (NTC) thermistors, etc.

The DC-DC converter 200 further includes an overcurrent protection circuit 214 coupled between the bullet terminals 204 and 206 to protect the DC-DC converter 200 from an overcurrent condition. For example, the overcurrent protection circuit 214 may be configured to inhibit the DC output current at the bullet terminal 206 from exceeding an overcurrent condition threshold that could damage the DC-DC converter 200.

The overcurrent protection circuit 214 may include any suitable overcurrent protection circuit topology. For example, the overcurrent protection circuit 214 can include one or more circuit breakers, fuses, resistors, switches, diodes, etc.

In addition to primary overcurrent protection provided by the overcurrent protection circuit 214, the DC-DC converter 200 may include a backup overcurrent function (e.g., a backup overcurrent protection circuit, switch, etc.). The backup overcurrent function can create a physical disconnect (e.g., an air gap, etc.) between the bullet terminals 204 and 206 in the event the overcurrent protection circuit 214 is not adequate to sufficiently limit the output current.

Although FIG. 2 illustrates one power and/or current limiter circuit 212 and a separate overcurrent protection circuit 214, other embodiments may combine a power limiter circuit, a current limiter circuit and an overcurrent protection circuit into a single circuit. Alternatively, the power limiter circuit, the current limiter circuit and the overcurrent protection circuit may each be separate from one another. In some cases, a DC-DC converter may include only one or two of the power limiter circuit, the current limiter circuit and the overcurrent protection circuit, which may be combined or separate from one another.

As mentioned above, the DC-DC converter 200 includes a controller 210. The controller 210 is illustrated as coupled with the DC-DC voltage converter circuit 208, the power or current limiter circuit 212 and the overcurrent protection circuit 214. However, in other embodiments the controller 210 may be coupled with only one or two of the DC-DC voltage converter circuit 208, the power or current limiter circuit 212 and the overcurrent protection circuit 214.

The controller 210 is configured to operate the power and/or current limiter circuit 212 to limit a DC output power or DC output current of the DC-DC converter 200 to below a specified output power threshold or specified output current threshold. For example, the controller 210 may be configured to control the power or current limiter circuit 212 to limit a DC output power of the DC-DC converter 200 to below a specified output power threshold in a range of about 100 W to about 2500 W.

Alternatively, or in addition, the controller 210 may be configured to control the power and/or current limiter circuit 212 to limit a DC output current of the DC-DC converter 200 to below a specified output current threshold value in a range of about 1 A to about 50 A. In other embodiments, the power and/or current limiter circuit 212 may limit a DC output power or current to below threshold values outside the range listed above.

Although FIG. 2 illustrates the controller 210 coupled with the power and/or current limiter circuit 212 to operate the power and/or current limiter circuit 212, in other embodiments the power and/or current limiter circuit 212 may be separate from the controller 210 (i.e., not coupled with the controller 210), the power and/or current limiter circuit 212 may operate without receiving any control signals from the controller 210, etc.

The controller 210 is configured to control the overcurrent protection circuit 214 to protect the DC-DC converter 200 from an overcurrent condition. For example, the controller 210 may be configured to control the overcurrent protection circuit 214 to inhibit the DC output current at the bullet terminal 206 from exceeding an overcurrent condition threshold that could damage the DC-DC converter 200.

As one example, the overcurrent protection circuit 214 may limit a DC output current of the DC-DC converter 200 to below a threshold value in a range of about 1 A to about 50 A. In other embodiments, the overcurrent protection circuit 214 may limit a DC output current to below threshold values outside the range listed above.

As described above, in addition to the primary overcurrent protection provided by the overcurrent protection circuit 214, the DC-DC converter 200 may include a backup overcurrent function (e.g., backup overcurrent protection circuit, switch, etc.) that creates an air gap between the bullet terminals 204 and 206 in the event the primary overcurrent protection provided by the overcurrent protection circuit 214 is not adequate to sufficiently limit the DC output current.

Although FIG. 2 illustrates the controller 210 coupled with the overcurrent protection circuit 214 to operate the overcurrent protection circuit 214, in other embodiments the overcurrent protection circuit 214 may be separate from the controller 210 (i.e., not coupled with the controller 210), the overcurrent protection circuit 214 may operate without receiving any control signals from the controller 210, etc.

As described herein, the controller 210 may be configured to perform operations using any suitable combination of hardware and software. For example, the controller 210 may include any suitable circuitry, logic gates, microprocessor (s), computer-executable instructions stored in memory, etc. operable to cause the controller 210 to perform actions described herein (e.g., operating the DC-DC voltage converter circuit 208, etc.).

In some embodiments, operation parameters of the DC-DC converter 200 may be adjustable by a user. For example, the user may be able to set one or more voltage values of the DC-DC voltage converter circuit 208 (e.g., voltage input values, voltage output values, voltage conversion values, etc.), a DC output power or current limit threshold value of the power and/or current limiter circuit 212, an overcurrent condition threshold value of the overcurrent protection circuit 214, etc.

These values may be set or adjusted prior to operation of the DC-DC converter 200, during operation of the DC-DC converter 200, etc. The values may be set or adjusted manually via input(s) on the housing 202 of the DC-DC converter 200, via a computing device coupled to the controller 210 of the DC-DC converter 200 via a wired and/or wireless connection, etc.

Figure 3:
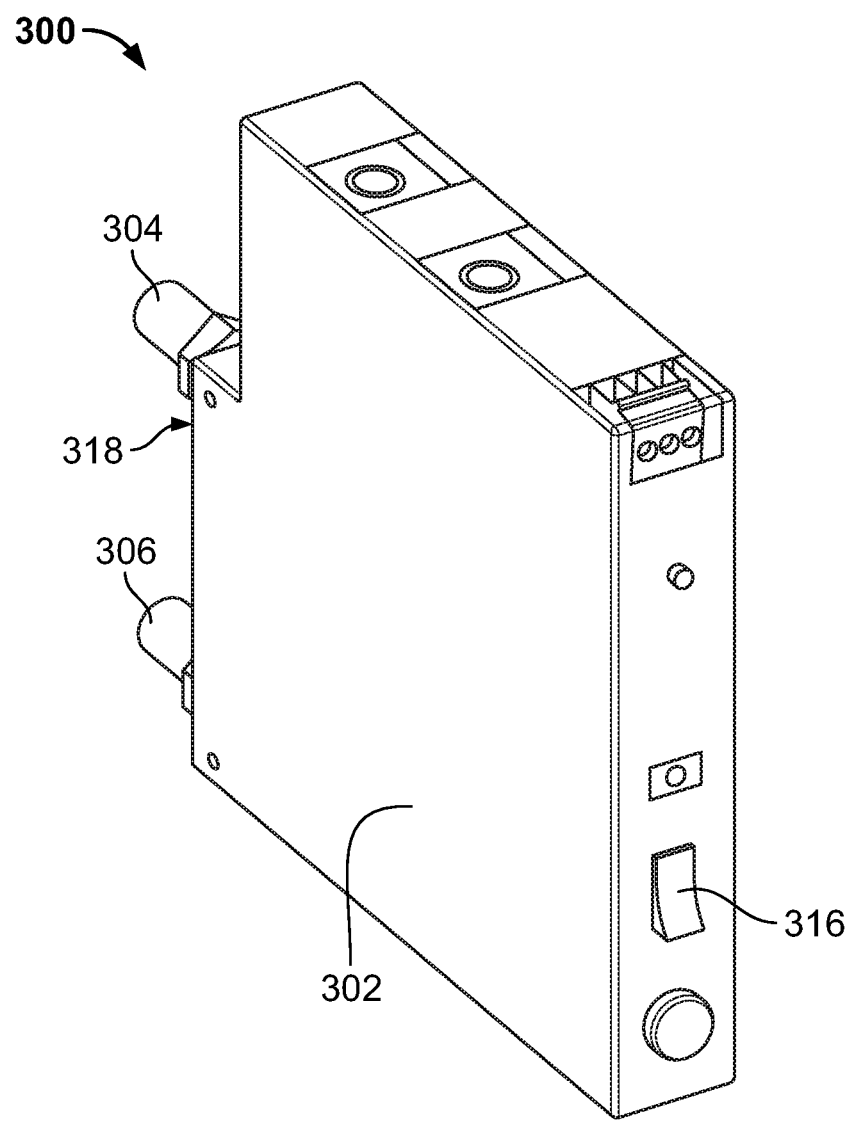
FIG. 3 is a perspective view of a DC-DC converter including a bullet nose converter housing, according to another example embodiment of the present disclosure.

FIG. 3 illustrates one example of an optional housing 302 of a DC-DC converter 300 according to another example embodiment of the present disclosure. As shown in FIG. 3, the housing 302 is a bullet nose converter housing. The housing 302 includes a pair of bullet terminals 304 and 306. Each of the bullet terminals 304 and 306 may be one of a bullet style line terminal, a bullet style load terminal, etc.

The DC-DC converter 300 may be similar to the DC-DC converter 100 and 200 of FIGS. 1 and 2. For example, the housing 302 of FIG. 3 may enclose one or more of the DC-DC voltage converter circuits 108 and 208, the power and/or current limiter circuit 212, the overcurrent protection circuit 214 and the controllers 110 and 210 illustrated in FIGS. 1 and 2.

The housing 302 includes a switch 316 (e.g., a toggle handle, a toggle switch, an on/off switch, an enable/disable switch, etc.). The switch 316 may be used to turn on and/or turn off the DC-DC converter 300, to reset the DC-DC converter 300 in the event that the DC-DC converter 300 trips due to a fault (e.g., an overcurrent condition, exceeding a power limit condition, etc.), etc.

For example, the DC-DC converter 300 may include one or more fault protection circuits coupled between the bullet terminal 304 and the bullet terminal 306. In the event that the fault protection circuit detects a fault condition of the DC-DC converter 300, experiences a fault condition, etc., the fault protection circuit can disable the DC-DC converter 300 (e.g., to disconnect the bullet terminal 304 from the bullet terminal 306 to create an open circuit).

The DC-DC converter 300 may include a low-voltage disconnect capability. For example, a controller (e.g., the controller 110 of FIG. 1, etc.) of the DC-DC converter 300 may be configured to sense, detect, etc. a low-voltage condition of the DC-DC converter 300 (e.g., when a DC voltage input or DC voltage output of the DC-DC converter 300 drops below a low-voltage condition threshold). In this case, the controller can disconnect the bullet terminal 304 from the bullet terminal 306 (e.g., by opening a circuit).

The DC-DC converter 300 can include any suitable current sense for sensing, detecting, etc. a DC input current or a DC output current of the DC-DC converter 300. Similarly, the DC-DC converter 300 can include any suitable voltage sense for sensing, detecting, etc. a voltage supplied to the DC-DC converter 300 from an external source (e.g., a remote radio input voltage on sense leads connected to the DC-DC converter 300, etc.).

For example, the voltage sense may sense a DC input voltage or a DC output voltage of the DC-DC converter 300. In these cases, the current sense or voltage sense may be coupled to the controller to provide sensed current or voltage values to the controller, and the controller may uses the sensed value(s) to adjust the DC output voltage of the DC-DC converter 300.

In some embodiments, a controller (e.g., the controller 110 of FIG. 1, etc.) of the DC-DC converter 300 may be configured to receive a manual on/off input. For example, the switch 316 may provide a manual on/off input to the controller. In other embodiments, the housing 302 may have a separate switch, button, etc. for manual on/off input.

In these cases, the controller can be configured to operate the DC-DC converter 300 according to the manual on/off input (e.g., to turn off operation of the device 300 in response to a manual off input, to turn on operation of the DC-DC converter 300 in response to a manual turn on input, etc.).

In some embodiments, the controller may be configured to receive a remote on/off input to operate the DC-DC converter 300 according to a remote on/off input command, control, etc. For example, the controller may be in communication with a remote computing device via a wired connection, a wireless connection (e.g., cellular, WiFi, BLUETOOTH, etc.). The remote computing device can provide on/off control input to the controller to turn on and turn off operation of the DC-DC converter 300 remotely.

As another optional feature, the controller may provide monitoring and/or programming capability to another computing device (e.g., a computer, a cellular phone, another commercial off-the-shelf (COTS) device, etc.), a display on the DC-DC converter 300 itself, etc. For example, the controller may communicate with the computing device via a wired connection, a wireless connection, etc. as described above. The controller may provide status of monitored parameters of the DC-DC converter 300 to the computing device, etc. In some embodiments, the computing device may be able to program the controller, etc.

As shown in FIG. 3, the housing 302 includes alarm contacts 318. The alarm contacts 318 are shaped to couple with standard alarm contacts (e.g., standard alarm pin locations, etc.) on a power panel, etc. to which the DC-DC converter 300 is coupled (i.e., via the bullet terminals 304 and 306).

The DC-DC converter 300 may be configured to detect an alarm condition of the DC-DC converter 300 (e.g., due to a fault condition of the DC-DC converter 300, etc.), and the alarm contacts 318 can be configured to provide an alarm signal when the alarm condition is detected.

For example, a controller (e.g., controller 114 of FIG. 1, etc.) may be coupled to the alarm contacts 318, and be configured to provide an alarm signal to the alarm contacts 318 in response to detection of the alarm condition of the DC-DC converter 300. In some embodiments, the DC-DC converter 300 may have the capability to generate an alarm or not generate an alarm when the switch 316 is in an off or disable position.

Figure 4:
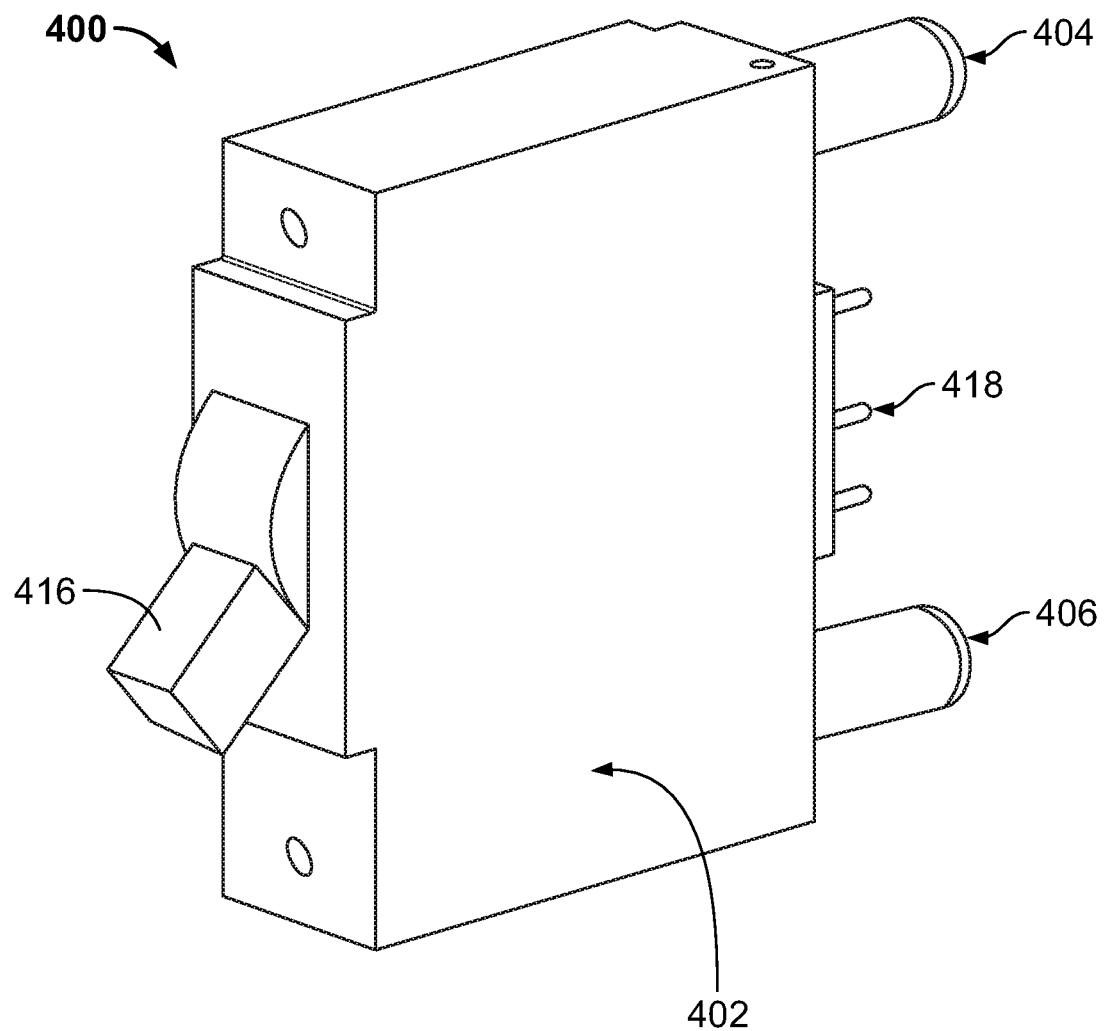
FIG. 4 is a perspective view of another DC-DC converter including a bullet nose toggle handle circuit breaker housing, according to another example embodiment of the present disclosure.

FIG. 4 illustrates an optional housing 402 of a DC-DC converter 400 according to another example embodiment of the present disclosure. As shown in FIG. 4, the housing 402 is a toggle handle bullet nose circuit breaker housing. Similar to the housing 302 in FIG. 3, the housing 402 includes a pair of bullet terminals 404 and 406. Each of the bullet terminals 404 and 406 may be one of a bullet style line terminal, a bullet style load terminal, etc.

The DC-DC converter 400 may be similar to the DC-DC converter 100 and 200 of FIGS. 1 and 2. For example, the housing 402 of FIG. 4 may enclose one or more of the DC-DC voltage converter circuits 108 and 208, the power and/or current limiter circuit 212, the overcurrent protection circuit 214 and the controllers 110 and 210 illustrated in FIGS. 1 and 2.

The housing 402 includes a switch 416 (e.g., a toggle handle, a toggle switch, an on/off switch, an enable/disable switch, etc.). The switch 416 may be used to turn on and/or turn off the DC-DC converter 400, to reset the DC-DC converter 400 in the event that the DC-DC converter 400 trips due to a fault (e.g., an overcurrent condition, exceeding a power limit condition, etc.), etc.

As shown in FIG. 4, the housing 402 includes alarm contacts 418, shaped to couple with standard alarm contacts on a circuit breaker, power panel, etc. The alarm contacts 418 may be similar to the alarm contacts 318 of the DC-DC converter 300 described above.

Figure 5:
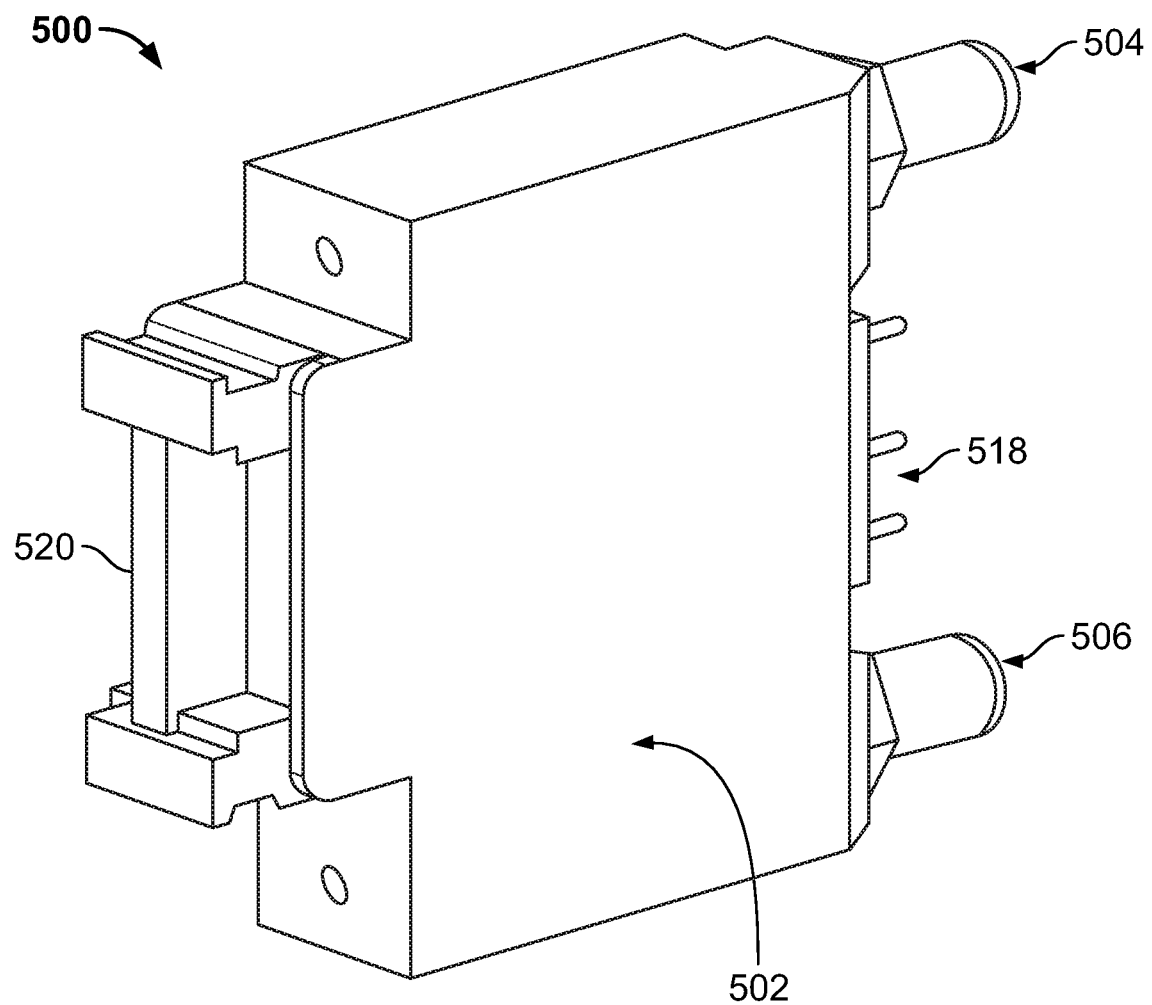
FIG. 5 is a perspective view of another DC-DC converter including a bullet nose fuseholder housing, according to another example embodiment of the present disclosure Corresponding reference numerals indicate corresponding features throughout the several views of the drawings.

FIG. 5 illustrates an optional housing 502 of a DC-DC converter 500 according to another example embodiment of the present disclosure. As shown in FIG. 5, the housing 502 is a bullet nose fuseholder housing. Similar to the housings 302 and 402 in FIGS. 3 and 4, the housing 502 includes two bullet terminals 504 and 506. Each of the bullet terminals 504 and 506 may be one of a bullet style line terminal, a bullet style load terminal, etc.

The DC-DC converter 500 may be similar to the DC-DC converter 100 and 200 of FIGS. 1 and 2. For example, the housing 502 of FIG. 5 may enclose one or more of the DC-DC voltage converter circuits 108 and 208, the power and/or current limiter circuit 212, the overcurrent protection circuit 214 and the controllers 110 and 210 illustrated in FIGS. 1 and 2.

The housing 502 includes a fuse 520. The fuse 520 may be any suitable fuse adapted to trip, etc. if the DC-DC converter 500 experiences a fault (e.g., overcurrent condition, exceeding a power limit condition, etc.), etc.

For example, the DC-DC converter 500 may include one or more fault protection circuits coupled between the bullet terminal 504 and the bullet terminal 506. In the event that the fault protection circuit detects a fault condition of the DC-DC converter 500, experiences a fault condition, etc., the fault protection circuit can trip the fuse 520 (e.g., to disconnect the bullet terminal 504 from the bullet terminal 506 to create an open circuit).

As shown in FIG. 5, the housing 502 includes alarm contacts 518, shaped to couple with alarm contacts on a circuit breaker, power panel, etc. The alarm contacts 518 may be similar to the alarm contacts 318 and 418 described above.

The housings 302, 402, and 502 may have package widths available in integer multiples of bullet device poles. In some embodiments, the DC-DC converter described herein may include a flying lead for facilitating connection to a return bus for a positive (+) or negative (−) voltage connection point.

The DC-DC converters described herein may include one or more visual indicators, such as an LED to show overcurrent conditions, open circuit conditions, device failure conditions, etc. The DC-DC converters may be UL listed, may be rated for operation up to sixty-five degrees Celsius (or higher), may meet FCC Class B standards, etc.

According to another example embodiment, a method of converting DC voltage using a DC-DC converter is disclosed. The DC-DC converter includes a housing having at least two bullet terminals. The at least two bullet terminals are configured to mate with corresponding terminals of a DC bullet breaker panel. The device also includes a DC-DC converter circuit coupled between the at least two bullet terminals, and a controller coupled with the DC-DC converter circuit.

The example method includes receiving a DC input voltage from one of the corresponding terminals of the DC bullet breaker panel at a first one of the at least two bullet terminals, and converting the received DC input voltage to a different DC output voltage using the DC-DC converter circuit. The method also includes supplying the converted DC output voltage to another one of the corresponding terminals of the DC bullet breaker panel via another one of the at least two bullet terminals.

In some embodiments, supplying the converted DC output voltage includes supplying the converted DC output voltage to wireless radio equipment located on a radio tower. In those cases, receiving the DC input voltage may include receiving the DC input voltage from a battery, and supplying the converted DC output voltage may include supplying the converted DC output voltage to the wireless radio equipment during a utility power outage.

As described herein, example embodiments can combine functionality of an overcurrent protection device, a disconnect switch, a DC-DC voltage converter circuit, a power and/or current limiter circuit, etc. in a DC-DC converter package having a form factor of a bullet DC circuit breaker to be plugged into a DC bullet breaker panel, so that the embodiments described herein can be used in any suitable DC power distribution system, etc. that incorporates bullet style circuit devices (e.g., bullet DC circuit breakers).

Example DC-DC converter described herein can be used in applications in which the DC power is delivered over long distances to the end load, etc. If the DC-DC converter has a DC output voltage that is regulated at a higher level than a DC input voltage, an end load can be sustained for a longer period of time during a battery discharge. The example DC-DC converters described herein may be suitable for meeting Class 2 circuit requirements, etc.

In one example, wireless service providers sometimes provide power radio equipment that is located on radio towers at various heights. Due to the cable loop length from the power system to the equipment, the DC voltage at the radio equipment is reduced and decreases during an AC outage (due to battery discharge). Wireless providers may deploy a stand-alone DC-DC converter system connected to an existing −48 VDC rectifier/battery plant to raise the output voltage to the loads to allow the radios to sustain operation during an outage as well as reduce the size of the cable feeding the remote loads. In addition, distributed antenna system (DAS) providers are deploying a Class 2 circuit converter system that keeps each circuit power to a limit of 100 VA. Installations of stand-alone converter systems require considerable extra expense as well as extra rack space. Example embodiments described herein may allow one or both of these functions to be implemented in existing power systems, reducing extra costs required as well as space required. Existing wiring could potentially be re-used, and labor required for installing a stand-alone converter plant could be reduced.

Example embodiments and aspects of the present disclosure may provide any one or more (or none) of the following advantages: DC-DC converters that are interchangeable with bullet DC circuit breakers having bullet terminals, combination of multiple DC-DC converter functions and features into a compact device, devices that can be used in equipment for multiple vendors, operability without requiring changes or modifications to existing equipment, communication with smartphones, etc.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A DC-DC converter comprising:
   a housing having at least two bullet terminals, the at least two bullet terminals configured to mate with corresponding terminals of a DC bullet breaker panel;
   a DC-DC voltage converter circuit coupled between the at least two bullet terminals;
   a controller coupled with the DC-DC voltage converter circuit, the controller configured to control the DC-DC voltage converter circuit to convert a DC input voltage at a first one of the at least two bullet terminals to a different DC output voltage at a second one of the at least two bullet terminals; and
   a power or current limiter circuit coupled between the at least two bullet terminals, the power or current limiter circuit configured to limit a DC output power or DC output current supplied at the second bullet terminal by the DC-DC converter, to below a specified output power threshold or specified output current threshold.

2. The DC-DC converter of claim 1, further comprising an overcurrent protection circuit coupled between the at least two bullet terminals, the overcurrent protection circuit configured to protect the DC-DC converter from an overcurrent condition.

3. The DC-DC converter of claim 2, wherein:
the controller is coupled with the power or current limiter circuit and configured to control the power or current limiter circuit to limit the DC output power or DC output current of the DC-DC converter to below a specified output power threshold or specified output current threshold; or
the controller is coupled with the overcurrent protection circuit and configured to control the overcurrent protection circuit to protect the DC-DC converter from an overcurrent condition.

4. The DC-DC converter of claim 2, wherein the overcurrent protection circuit is configured to protect the DC-DC converter from an overcurrent condition at a DC output current threshold in a range of between 1 A and 50 A.

5. The DC-DC converter of claim 1, wherein the controller is configured to operate the DC-DC voltage converter circuit to convert the DC input voltage within a specified voltage input range to the DC output voltage within a specified voltage output range.

6. The DC-DC converter of claim 5, wherein the specified voltage input range is about −42 VDC to −58 VDC.

7. The DC-DC converter of claim 5, wherein the specified voltage output range is about −48V to −72 VDC.

8. The DC-DC converter of claim 1, wherein the power or current limiter circuit is configured to limit the DC output power to below the specified output power threshold in a range of between 100 W and 2500 W.

9. The DC-DC converter of claim 1, wherein the power or current limiter circuit is configured to limit the DC output current to below the specified output current threshold in a range of between 1 A and 50 A.

10. The DC-DC converter of claim 1, wherein the at least two bullet terminals include a bullet style line terminal or a bullet style load terminal.

11. The DC-DC converter of claim 1, wherein the housing has substantially the same form factor as a bullet DC circuit breaker.

12. The DC-DC converter of claim 1, further comprising:
a current sense coupled to detect a DC input current or DC output current of the DC-DC converter; or
a voltage sense coupled to detect a DC input voltage of the DC-DC converter, a DC output voltage of the DC-DC converter, or a voltage on an input of a remote radio unit used to control the DC output voltage of the DC-DC converter.

13. The DC-DC converter of claim 1, further comprising a fault protection circuit coupled between the at least two bullet terminals.

14. The DC-DC converter of claim 1, wherein the controller is configured to receive a remote on/off input to control the DC-DC converter via a remote on/off operation control.

15. The DC-DC converter of claim 1, further comprising an alarm contact positioned on an outer portion of the housing, the alarm contact configured to transmit an alarm signal when an alarm condition of the DC-DC converter is detected.

16. A DC power distribution system including the DC-DC converter of claim 1, the DC power distribution system further comprising a DC bullet breaker panel having at least two bullet terminals, wherein the at least two bullet terminals of the DC-DC converter are coupled with the at least two bullet terminals of the DC bullet breaker panel.

17. The DC-DC converter of claim 1, wherein:
the controller is configured to communicate with a computing device to allow the computing device to monitor or program the DC-DC converter;
the controller is configured to receive a manual on/off input to control the DC-DC converter via a manual on/off operation control; or
the controller is configured to disconnect at least one of the bullet terminals when a low-voltage condition is detected.

18. A method of converting DC voltage using a DC-DC converter, the DC-DC converter including a housing having at least two bullet terminals, a DC-DC voltage converter circuit coupled between the at least two bullet terminals, a power or current limiter circuit coupled between the at least two bullet terminals, and a controller coupled with the DC-DC voltage converter circuit, the at least two bullet terminals configured to mate with corresponding terminals in a DC bullet breaker panel, the method comprising:
receiving, at a first one of the at least two bullet terminals, a DC input voltage from one of the corresponding terminals of the DC bullet breaker panel;
converting, by the DC-DC voltage converter circuit, the received DC input voltage to a different DC output voltage;
supplying, via a second one of the at least two bullet terminals, the converted DC output voltage to another one of the corresponding terminals of the DC bullet breaker panel; and
limiting, by the power or current limiter circuit, a DC output power or DC output current supplied at the second bullet terminal by the DC-DC converter, to below a specified output power threshold or specified output current threshold.

19. The method of claim 18, wherein supplying the converted DC output voltage includes supplying the converted DC output voltage to wireless radio equipment located on a radio tower.

20. The method of claim 19, wherein:
receiving the DC input voltage includes receiving the DC input voltage from a battery; and
supplying the converted DC output voltage includes supplying the converted DC output voltage to the wireless radio equipment during a utility power outage.

* * * * *